(12) United States Patent
Becker (10) Patent No.: US 9,153,303 B2
(45) Date of Patent: Oct. 6, 2015

(54) METHODS AND APPARATUSES FOR ALTERNATE CLOCK SELECTION

(71) Applicant: Micron Technology, Inc., Boise, ID (US)

(72) Inventor: Eric Becker, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 96 days.

(21) Appl. No.: 14/031,470

(22) Filed: Sep. 19, 2013

(65) Prior Publication Data

US 2015/0078101 A1 Mar. 19, 2015

(51) Int. Cl.
*G11C 7/10* (2006.01)
*G11C 7/22* (2006.01)
*H03L 7/06* (2006.01)
*G11C 29/02* (2006.01)
*G11C 29/12* (2006.01)

(52) U.S. Cl.
CPC .............. *G11C 7/222* (2013.01); *G11C 29/023* (2013.01); *G11C 29/028* (2013.01); *G11C 29/12015* (2013.01); *H03L 7/06* (2013.01)

(58) Field of Classification Search
CPC ....... G11C 7/1006; G11C 7/1051; G11C 8/12
USPC ....................... 365/189.02, 233.11
See application file for complete search history.

(56) References Cited

U.S. PATENT DOCUMENTS 6,816,023 B1 * 11/2004 Currier et al. ................... 331/74

* cited by examiner

*Primary Examiner* — Huan Hoang
(74) *Attorney, Agent, or Firm* — Schwegman Lundberg & Woessner, P.A.

(57) ABSTRACT

Apparatuses and methods are disclosed, such as those including an oscillator circuit that generates an alternate clock. A multiplexing circuit can be coupled to the alternate clock and an input clock. The alternate clock has a more accurate duty cycle than the input clock. A clock path can be coupled to an output of the multiplexing circuit. The more accurate alternate clock can be coupled to the clock path during a test mode.

18 Claims, 7 Drawing Sheets

METHODS AND APPARATUSES FOR ALTERNATE CLOCK SELECTION

TECHNICAL FIELD

The present embodiments relate generally to memory and alternate clock selection in a memory.

BACKGROUND

Memory devices are typically provided as internal, semiconductor, integrated circuits in computers or other electronic devices. There are many different types of memory including random-access memory (RAM), read only memory (ROM), non-volatile (e.g., flash) memory, dynamic random access memory (DRAM), and synchronous dynamic random access memory (SDRAM).

As system speeds have increased, the speed of the clock signals (which are sometimes hereinafter referred to herein as "clocks") provided to operate memory devices in such systems have increased. Conventionally, such systems operate memory devices with clock signals that have a targeted duty cycle of 50%. As is well known in the art, a clock signal's duty cycle is the percentage of time that the clock signal spends in an active (e.g., high) state relative to the total clock period.

Prior to putting a memory device in operation or in the stream of commerce, it is conventionally tested (e.g., by or for the manufacturer of the memory device or a system including such a memory device, wherein such a system is referred to hereinafter as "the target system") using a tester that provides the memory device with a clock signal that simulates the clock signal it would be provided in the target system. Ideally, it would be desirable for such testers to provide a clock signal having a duty cycle as close to the target duty cycle (e.g., a 50% duty cycle) as the duty cycle of a clock signal that will be provided in the target system. Unfortunately, conventional volume production testers are incapable of reliably providing such a clock signal, particularly as the speed of such clock signals have increased.

Figure 1:
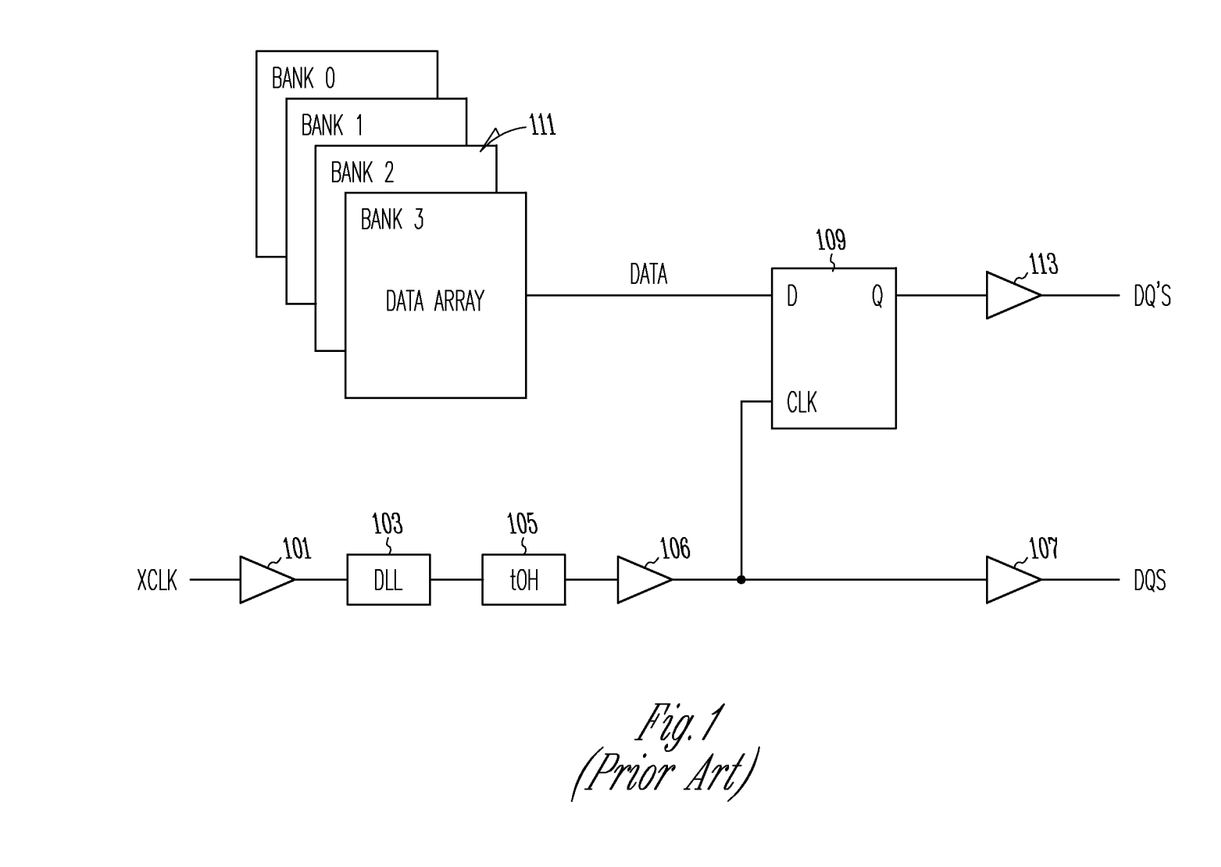
FIG. 1 illustrates a block diagram of an embodiment of a typical prior art clock circuit.

FIG. 1 illustrates a block diagram of an embodiment of a typical prior art memory clock circuit. This circuit can provide a clock for clocking data out of the memory device as well as providing (e.g., coupling, generating, inputting, introducing, etc.) a testing clock for use internal to the memory array.

The clock provided to the memory device (XCLK) is input to an input clock buffer 101 before being input to a delay-locked loop (DLL) 103. The output of the DLL 103 goes through another buffer prior to being input to an output high trim block (tOH) 105. The output high trim block 105 can provide a fixed trim function to remove duty cycle error that has been introduced by memory device components.

The trimmed clock can then be output through a buffer 106 to both a data latch 109 and a clock output buffer 107. The clock can clock data from the memory array 111 into the data latch 109 in order to output the data through a data output buffer 113. The clock can also be output through the clock output buffer 107 as a DQS output strobe, such as to inform external circuits that data is going to be output by the memory device.

A problem can exist when an inaccurate external clock is input to the output high trim block 105 for trimming purposes (e.g., such as a clock provided by a volume production tester). Not only is the external clock inaccurate but the memory device components can introduce additional duty cycle error. The output high trim block 105 would then be set to correct the total duty cycle error as necessary to provide a 50% duty cycle in response to the inaccurate external test clock. Thus, when a more ideal (e.g., 50% duty cycle) clock is again used (e.g., such as a clock provided by the target system for normal operation of the memory device), the output high trim block 105 can introduce an error on the output trimmed clock.

DETAILED DESCRIPTION

In the following detailed description, reference is made to the accompanying drawings that form a part hereof and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

Figure 2:
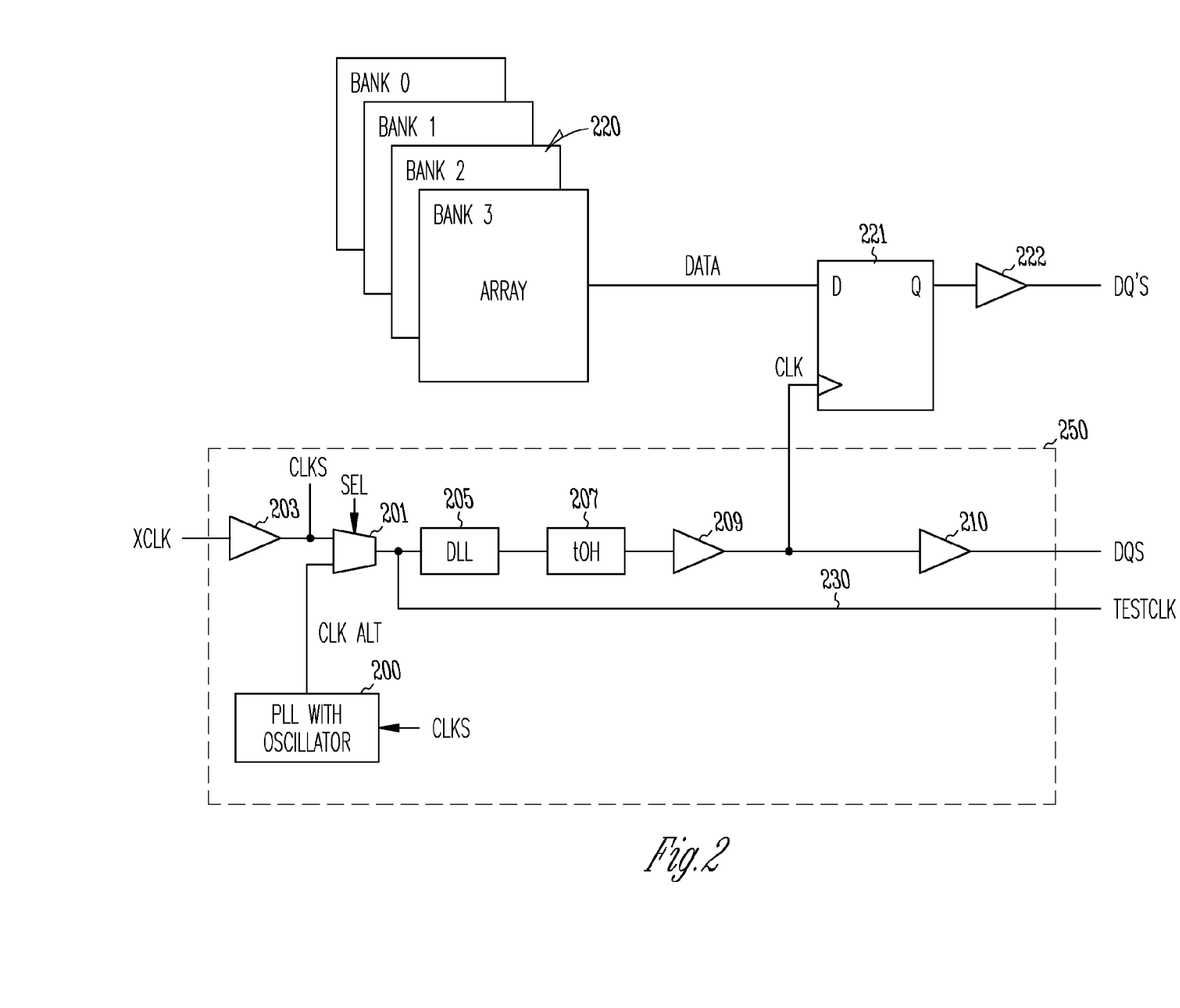
FIG. 2 illustrates a block diagram of an embodiment of an alternate clock circuit.

FIG. 2 illustrates a block diagram of an embodiment of an alternate clock circuit 250. Such a clock circuit 250 can provide an alternate clock into any clock path of a memory device. For example, during a precision output tuning of portions of the memory device (e.g., output high trim 207), a more accurate duty cycle alternate clock (e.g., CLKALT) can be switched into a clock path 230 in place of a less accurate duty cycle input clock (e.g., XCLK from a tester). In an embodiment, a more accurate duty cycle clock can have a duty cycle that is closer to a target duty cycle than that of a less accurate duty cycle clock.

The alternate clock circuit 250 is configured to receive an input clock XCLK at an input clock buffer 203. The input clock XCLK might be generated by clock generation circuitry (not shown) that can include a crystal oscillator or other clock generation circuitry, such as the clock generation circuitry on a tester or as part of a target system.

An oscillator circuit 200 can comprise a phase-locked loop (PLL) with oscillator for generating the alternate clock CLKALT. In order to synchronize the alternate clock with the input clock, the output CLKS of the input clock buffer 203 can be input to the oscillator circuit 200. One example of an embodiment of an oscillator circuit 200 is the phase-locked loop with oscillator illustrated in FIG. 3 and described subsequently. The output of the oscillator circuit 200 can be input to a multiplexing circuit 201.

The multiplexing circuit 201 can select between the "normal" clock CLKS and the alternate clock CLKALT. A select signal SEL can be used to select between the two inputs. For example, if select signal SEL is in a first state (e.g., logic 0), the CLKS input can be selected. If the select signal SEL is in a second state (e.g., logic 1), the CLKALT input can be selected. Another embodiment can reverse this selection logic.

The output of the multiplexing circuit 201 (e.g., TESTCLK) can be input to a delay-locked loop (DLL) 205. The DLL 205, similar to a PLL with the oscillator replaced by a delay line, can be used to adjust the phase of the clock from the multiplexing circuit 201.

The output of the DLL 205 can be input to an output high trim circuit (tOH) 207 (e.g., trim circuit). The output high trim circuit 207 can provide a static duty cycle trim to any clock that is input to the output high trim circuit 207. In an embodiment, the output high trim circuit 207 can be fuse programmed to provide a certain amount of trim (e.g., duty cycle correction) to the duty cycle of a clock, such as to correct for delays caused by components in the clock path 230.

The clock from the output high trim circuit 207 can be input to a buffer 209 and output as clock signal CLK to both a data latch 221 and a clock output buffer 210. The clock output buffer 210 can output a DQS signal that can act as an output strobe to inform external circuits that the memory device is about to output data.

The clock CLK from the output high trim circuit 207 and buffer 209 can be coupled to the clock input of the data latch 221. The clock CLK can then clock data from the memory array 220 through the data latch 221 to a data output buffer 222. The data output buffer can then be coupled to the output pads (e.g., DQ's) of the memory device for connection to external circuitry.

The embodiment of FIG. 2 shows the input of the TESTCLK to only one entry point of the clock path 230. In an embodiment that has multiple clock path entry points, the TESTCLK can be input to any or each of these entry points. Thus, the TESTCLK having a more ideal duty cycle can be provided to the different entry points of the clock path, such as to determine a source of duty cycle degradation in the clock path.

Figure 7:
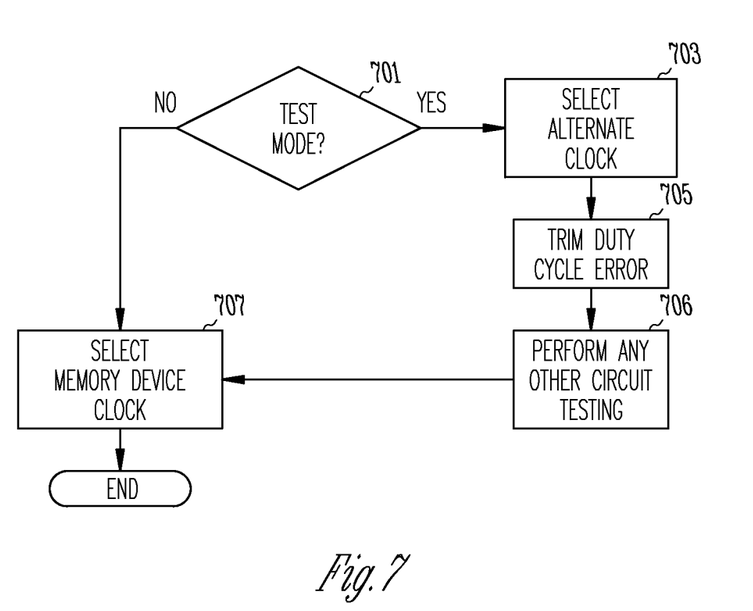
FIG. 7 illustrates a flowchart of a method of alternate clock selection in accordance with the alternate clock circuit of FIG. 2.

FIG. 7 illustrates a flowchart of an embodiment for operation of the circuit of FIG. 2. If a test mode is selected 701, the multiplexing circuit 201 can select the alternate clock CLKALT 703 as the clock to be input to the clock path 230 as TESTCLK. The alternate clock CLKALT can then be input, through the multiplexing circuit 201 and DLL 205, to the output high trim circuit 207. The amount of duty cycle error caused by the clock path 230 can then be trimmed out 705 by programming the trim correction (e.g., programming fuses) into the output high trim circuit 207. Other testing can also be performed on the memory circuits using the TESTCLK. For example, the TESTCLK can be input (e.g., during the test mode) to one or more other clock path entry points in an embodiment with multiple clock path entry points.

Once the test mode is complete, the normal clock CLKS can be selected 707 by the multiplexing circuit for a normal memory operation mode. This clock can then be used as the DQS output as well as the clock for clocking the data through the data latch 221.

The method of FIG. 7 illustrates only one example of a use for the alternate clock CLKALT. Other embodiments using a more ideal duty cycle clock provided by the oscillator circuit 200 can also be implemented.

Figure 3:
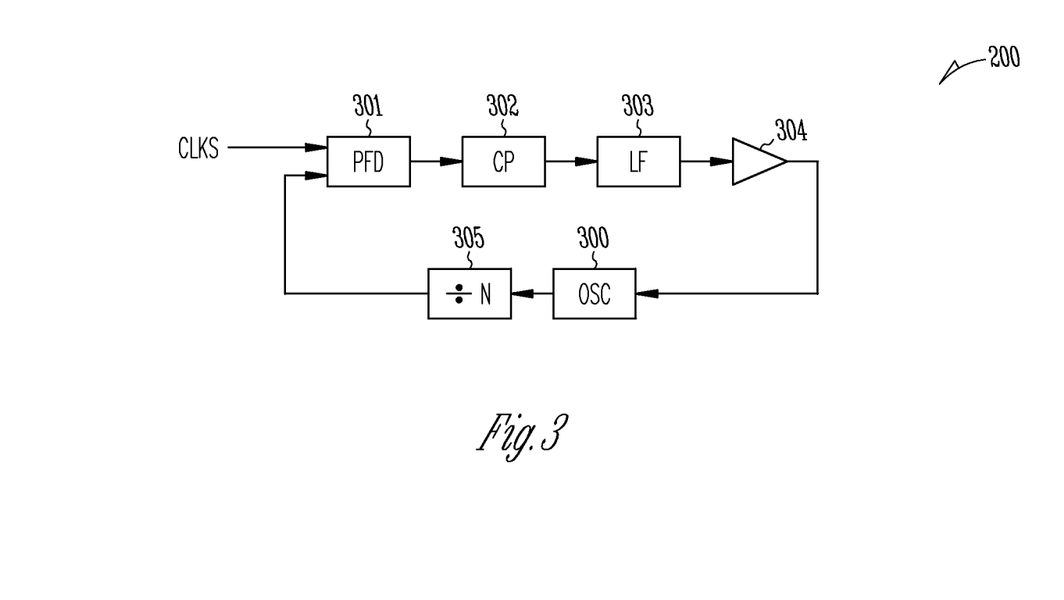
FIG. 3 illustrates a block diagram of an embodiment of a quadrature phase-locked loop in accordance with the alternate clock circuit of FIG. 2.

FIG. 3 illustrates a block diagram of an embodiment of a quadrature PLL with oscillator (e.g., oscillator circuit 200) in accordance with the alternate clock circuit of FIG. 2. The PLL with oscillator embodiment is for purposes of illustration only as the present embodiments are not limited to any one oscillator circuit 200.

The clock CLKS from FIG. 2 is shown being input to a phase frequency detector PFD circuit 301. As explained previously, this can synchronize the PLL circuit 200 to the input clock. The PFD circuit 301 can control the voltage controlled oscillator 300 such that the phase difference between the CLKS signal and a divided down output of the voltage controlled oscillator 300 can be held constant. Thus, the PFD can be referred to as a negative feedback system.

A charge pump circuit 302 can be coupled to an output of the PFD circuit 301. The charge pump 302 can convert timed logic levels from the PFD circuit 301 into analog signals for controlling the voltage controlled oscillator 300.

A filter circuit 303 (e.g., low pass filter) can be coupled to an output of the charge pump circuit 302. The filter circuit 303 can be used to limit the amount of reference frequency energy that can appear on the PFD 301 output that is then applied to the voltage controlled oscillator 300 control input. The low pass characteristics of the filter circuit 303 can attenuate this energy.

An output of the filter circuit 303 can be coupled to a buffer circuit 304 prior to being input to the voltage controlled oscillator 300. The buffer circuit 304 can be either a voltage buffer amplifier or a current buffer amplifier and can be used to transfer a voltage or a current, respectively, from the filter circuit 303 having a first impedance to the voltage controlled oscillator 300 having a second, different impedance.

The voltage controlled oscillator 300 can generate a variable frequency signal as controlled by the PFD circuit 301. The output of the voltage controlled oscillator 300 can be coupled to a divider 305 between the voltage controlled oscillator 300 and the PFD circuit 301. The divider 305 can be a programmable divider or a fixed divider.

Figure 4A:
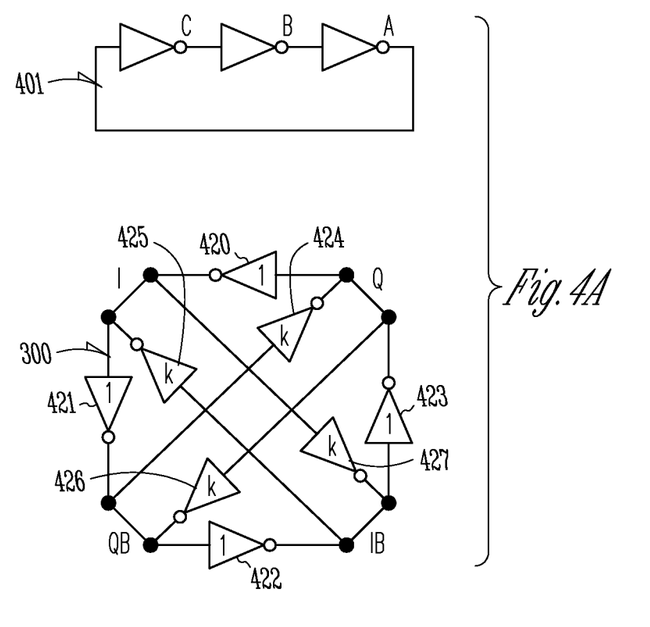
FIGS. 4A and 4B illustrate block diagrams of a conventional and a tetrahedral oscillator with a comparison of their respective output waveforms.
Figure 4B:
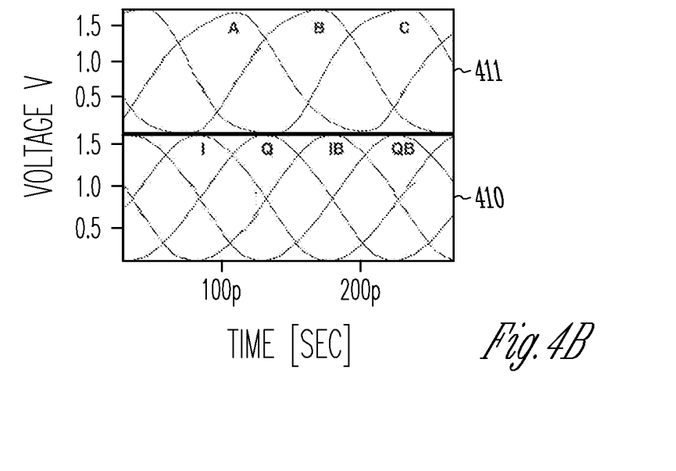

One example of a circuit for a voltage controlled oscillator 300 in FIG. 3 is a tetrahedral voltage controlled oscillator 300 as illustrated in FIG. 4A in comparison to a "conventional" oscillator 401. The tetrahedral voltage controlled oscillator 300 can be used in the PLL circuit 301 of FIG. 3 to provide a more "ideal" (e.g., 50% duty cycle) clock as the alternate clock CLKALT in FIG. 2 as compared to the clock provided by a conventional oscillator 401. FIG. 4B illustrates respective output waveforms 410, 411 of each of these oscillators 300, 401.

The tetrahedral voltage controlled oscillator 300 can be considered to be a composition of two hyper ring oscillators. For example, inverters 420-424, 427 can be one hyper ring oscillator while inverters 420-423, 425, 426 can be another hyper ring oscillator. The tetrahedral voltage controlled oscillator 300 can output quadrature phase signals 410 as shown in FIG. 4B.

Each of the quadrature phase output signals of the tetrahedral voltage controlled oscillator circuit 300 are labeled as I, Q, IB, and QB on the circuit of FIG. 4A. These outputs correspond to the I, Q, IB, and QB signals illustrated in the waveforms 410 of FIG. 4B.

The conventional oscillator 401 illustrated in FIG. 4A can output three phase signals 411 as shown in FIG. 4B. Each of the three phase output signals of the conventional oscillator 401 are labeled as A, B, and C on the circuit of FIG. 4A. These outputs correspond to the A, B, and C signals illustrated in the waveforms 411 of FIG. 4B.

Figure 5:
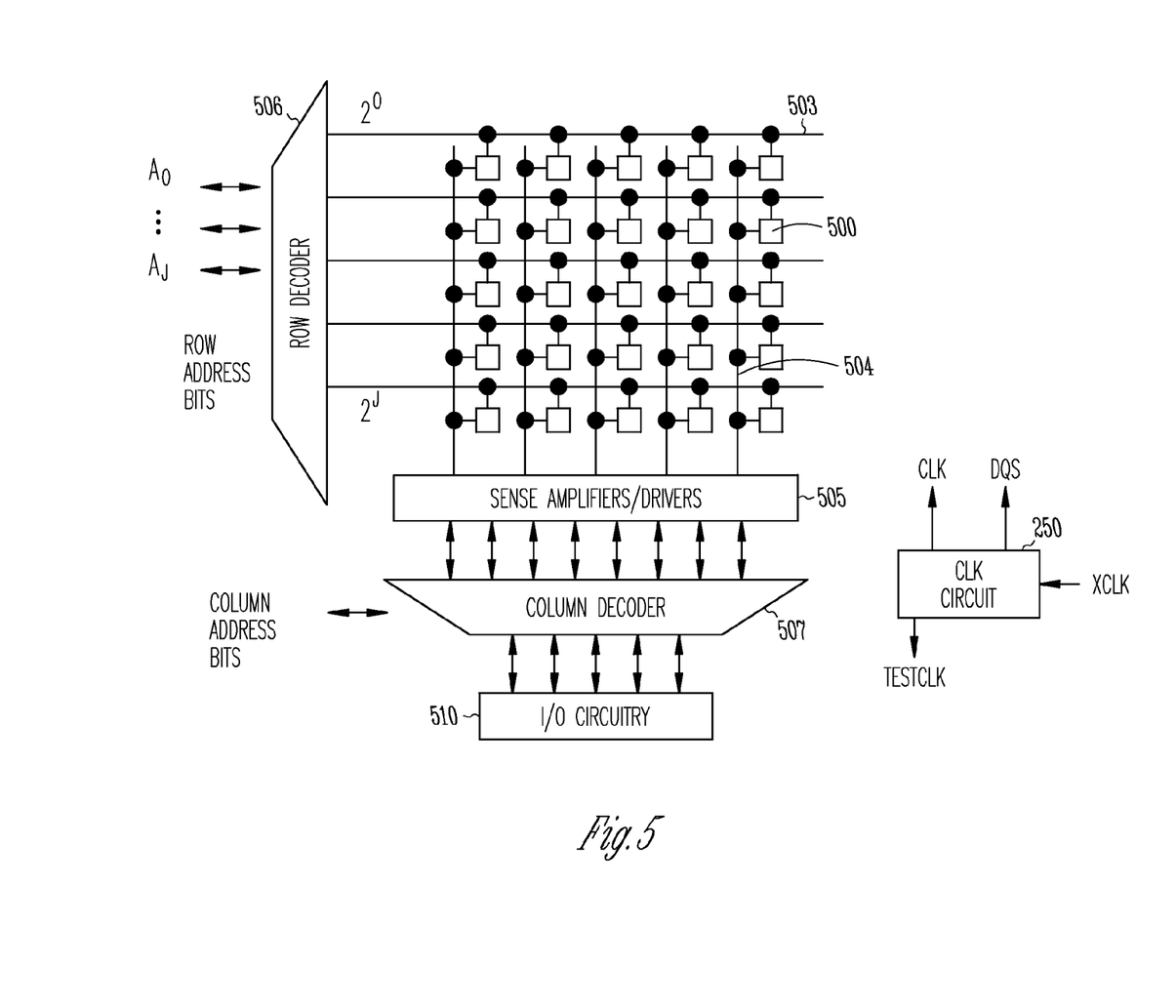
FIG. 5 illustrates a block diagram of an embodiment of a memory device in accordance with the alternate clock circuit of FIG. 2.

FIG. 5 illustrates a block diagram of an embodiment of a memory device (e.g., DRAM) that can incorporate a clock circuit such as alternate clock circuit 250. The device comprises a plurality of memory cells 500 (e.g., an array of memory cells), each memory cell 500 being coupled between an access line (e.g., word line) 503 and a data line (e.g., digit line) 504.

The data lines 504 are coupled to sense circuits/drivers 505 that can sense the states of the memory cells 500. The sensing can occur through sense circuits 505 when the memory cell capacitors are coupled to the data lines through their respective enabled activation devices.

A row decoder 506 is coupled to the access lines 503 to generate the access line signals in response to a row address from a controller (not shown in FIG. 5). A column decoder 507 is coupled to the sense circuits/drivers 505 and generates a column address through drivers onto the data lines 504 in response to a column address from the controller. The column decoder 507 also outputs the sensed states from the memory cells 500 as well as accepts the data to be stored in the memory cells 500.

The outputs from the column decoder 507 are input to the input/output (I/O) circuitry 510. The I/O circuitry 510 can include data pad (e.g., DQ) I/O circuitry.

The alternate clock circuit 250 of FIG. 2 can be used in such a memory device to provide an alternate clock into the memory device for various purposes. For example, during testing and trimming of different circuits of the memory device, a more "ideal" (e.g., 50% duty cycle) clock (e.g., from a tetrahedral oscillator) can be used to temporarily replace the normal memory clock (e.g., the external clock provided to a pin of the memory device, whether that be from a tester or from a system that uses the memory device).

Figure 6:
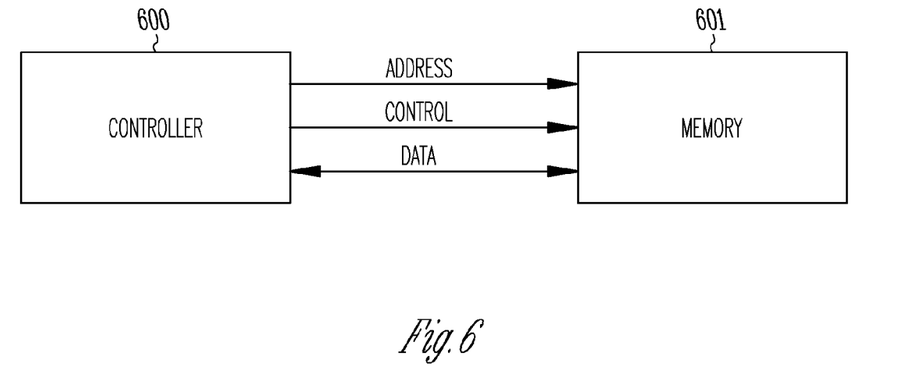
FIG. 6 illustrates block diagram of a system in accordance with the alternate clock circuit of FIG. 2.

FIG. 6 illustrates a block diagram of an embodiment of a system, in accordance with the embodiment of FIG. 5. The system can include a controller 600 (e.g., control circuitry, microprocessor) coupled to a memory 601 over address, control, and data buses. In one embodiment, the controller 600 and memory 601 are part of the same DRAM device. In another embodiment, the memory 601 is part of a memory device and the controller 600 is a separate integrated circuit.

An apparatus may be defined as circuitry, an integrated circuit die, a memory device, a memory array, or a system.

CONCLUSION

One or more embodiments of alternate clock selection methods and apparatuses can provide a more accurate alternate clock to clock paths at different times (e.g., testing, trimming). For example, a tetrahedral oscillator that generates a clock having a duty cycle that is closer to a target duty cycle of 50%, as compared to that of a clock generated by a conventional oscillator clock of a conventional volume production tester, can be switched into clock paths during trimming of various circuits in a memory device. Although the use of such an alternate clock has primarily been discussed in the context of testing and/or trimming memory devices, the present invention is not limited to such embodiments (e.g., in other embodiments, an alternate clock could be used during "normal" operation of an apparatus, regardless of whether that apparatus is or includes a memory device or some other type of device).

Although specific embodiments have been illustrated and described herein, it will be appreciated by those of ordinary skill in the art that any arrangement that is calculated to achieve the same purpose may be substituted for the specific embodiments shown. Many adaptations will be apparent to those of ordinary skill in the art. Accordingly, this application is intended to cover any adaptations or variations.

What is claimed is:

1. An apparatus comprising:
   an oscillator circuit to provide a first clock signal;
   a multiplexing circuit coupled to receive the first clock signal and a second clock signal, wherein a duty cycle of the first clock signal is closer to a target duty cycle for the apparatus than a duty cycle of the second clock signal; and
   a clock path coupled to an output of the multiplexing circuit, wherein the clock path comprises a plurality of entry points, each of the plurality of entry points coupled to an output of the multiplexing circuit.

2. The apparatus of claim 1 wherein the target duty cycle is a 50% duty cycle.

3. The apparatus of claim 1 wherein the clock path comprises:
   a delay-locked loop coupled to the output of the multiplexing circuit; and
   a trim circuit coupled to the delay-locked loop.

4. The apparatus of claim 3 wherein the trim circuit is an output high trim circuit.

5. The apparatus of claim 1 wherein the oscillator circuit comprises a phase-locked loop with a voltage controlled oscillator.

6. The apparatus of claim 5 wherein the voltage controlled oscillator is a tetrahedral oscillator.

7. The apparatus of claim 5 wherein the phase-locked loop with voltage controlled oscillator is coupled to receive the second clock signal.

8. An apparatus comprising:
   a multiplexing circuit having first and second clock inputs, the multiplexing circuit to select the first clock input during a first mode of operation and to select the second clock input during a second mode of operation;
   an oscillator circuit coupled to the multiplexing circuit, the oscillator circuit to provide a clock signal to the first clock input; and
   a clock path having a plurality of entry points, each of the plurality of entry points coupled to an output of the multiplexing circuit.

9. The apparatus of claim 8 wherein a duty cycle of the clock signal provided to the first clock input is closer to a 50% duty cycle than a duty cycle of a clock signal provided to the second clock input.

10. The apparatus of claim 8 wherein the oscillator circuit comprises a tetrahedral oscillator.

11. The apparatus of claim 8 and further comprising a strobe output coupled to the clock path.

12. The apparatus of claim 8 and further comprising:
    a memory array; and
    a data latch coupled to the memory array and having a clock input coupled to the clock path.

13. A memory device comprising:
    a memory array;
    a data latch coupled to the memory array; and
    a clock circuit coupled to the data latch, the clock circuit comprising:
    a multiplexing circuit coupled to receive a first clock signal and a second clock signal, the multiplexing circuit having a selection input for selecting the first clock signal for a normal operation mode and the second clock signal for a test mode;
    an oscillator circuit coupled to the multiplexing circuit, wherein the oscillator circuit provides the second clock signal in response to the first clock signal such that a duty cycle of the second clock signal is closer to a target duty cycle for the memory device than a duty cycle of the first clock signal;

a delay-locked loop coupled to the multiplexing circuit to adjust a phase of one of the first or the second clock signals; and an output high trim circuit coupled between the delay-locked loop and the data latch, the output high trim circuit to be configured in response to the second clock signal.

14. The memory device of claim 13 wherein the oscillator circuit is configured to provide the second clock signal such that it is synchronized with the first clock signal.

15. A method comprising:

selecting a first clock signal in response to entry into a test mode of a memory device, wherein selecting the first clock signal causes the first clock signal to be provided to a clock path entry point; and selecting a second clock signal in response to entry into a normal operation mode of the memory device, wherein selecting the second clock signal causes the second clock signal to be provided to the clock path entry point and wherein the first clock signal has a duty cycle that is closer to a target duty cycle for the memory device than the second clock signal.

16. The method of claim 15 and further comprising:

trimming a circuit of the memory device in response to the first clock signal.

17. The method of claim 15 and further comprising generating the first clock signal with an oscillator, wherein the first clock signal is synchronized to the second clock signal.

18. The method of claim 15 and further comprising generating the first clock signal with a phase-locked loop having a tetrahedral oscillator, wherein the first clock signal is synchronized to the second clock signal.

* * * * *